United States Patent [19]

McEachern et al.

[11] Patent Number: 5,298,859
[45] Date of Patent: Mar. 29, 1994

[54] HARMONIC-ADJUSTED WATT-HOUR METER

[75] Inventors: Alexander McEachern, Oakland, Calif.; William A. Moncrief, Marietta, Ga.

[73] Assignee: Basic Measuring Instruments, Foster City, Calif.

[21] Appl. No.: 840,850

[22] Filed: Feb. 25, 1992

[51] Int. Cl.⁵ .......................................... G01R 21/06
[52] U.S. Cl. ...................................... 324/142; 364/483
[58] Field of Search ................ 324/142, 141, 116, 137, 324/138, 83 R, 83 D, 126; 364/483; 340/646

[56] References Cited

U.S. PATENT DOCUMENTS

| | | | |
|---|---|---|---|
| 3,688,192 | 8/1972 | Ramsey, Jr. | 324/137 |
| 3,710,245 | 1/1973 | Clay et al. | 324/138 |
| 4,345,311 | 8/1982 | Fielden | 364/483 |
| 4,419,619 | 12/1983 | Jindrick et al. | 340/646 |
| 4,611,207 | 9/1986 | Anderson et al. | 324/126 |
| 4,615,009 | 9/1986 | Battocletti et al. | 364/483 |
| 4,672,555 | 6/1987 | Hart et al. | 364/483 |
| 4,794,369 | 12/1988 | Haferd | 341/166 |
| 4,814,696 | 3/1989 | Kern et al. | 324/142 |
| 4,884,021 | 11/1989 | Hammond et al. | 324/142 |
| 4,937,520 | 6/1990 | Arseneau et al. | 324/141 |
| 4,980,634 | 12/1990 | Mallinson | 324/142 |
| 5,061,890 | 10/1991 | Longini | 324/142 |

OTHER PUBLICATIONS

Recommended Practice for Establishing Transformer Capability when Supplying Nonsinusoidal Load Currents, ANSI/IEEE C57.110-1986.
IEEE Guide for Harmonic Control and Reactive Compensation of Static Power Converters, ANSI/IEEE Std 519-1981.

Primary Examiner—Ernest F. Karlsen
Attorney, Agent, or Firm—Haverstock, Medlen & Carroll

[57] ABSTRACT

An electric power measuring system wherein the watt-hour measurements are adjusted to account for the economic effects of harmonic currents and voltages. Well known techniques are used to acquire frequency spectra that represent the voltages and currents present at the measuring point. These spectra are used to calculate power flow direction and magnitude at various frequencies. Weighting functions are applied to power flows at frequencies other than the fundamental frequency. The weighted power flow is used to calculate an harmonic-adjusted watt measurement, which is then accumulated to form a harmonic-adjusted watt-hour measurement. The weighting functions can be selected to provide an economic incentive for a power consumer to consume power in a way that matches the goals of the power provider.

5 Claims, 3 Drawing Sheets

| Frequency | Adjustment factors for negative power flow (from nominal load to nominal source) | Adjustment factors for positive power flow (from nominal source to nominal load) |
|---|---|---|
| 60.0 Hz | 1.0 | 1.0 |
| 180.0 Hz | 1.0 | 1.0 |
| 300.0 Hz | 1.0 | 1.0 |
| 420.0 Hz | 1.0 | 1.0 |
| ⋮ 33 | ⋮ 34 | ⋮ 35 |

FIG. 3 *(prior art)*

| Frequency | Adjustment factors for negative power flow (from nominal load to nominal source) | Adjustment factors for positive power flow (from nominal source to nominal load) |
|---|---|---|
| 60.0 Hz | 1.0 | 1.0 |
| 180.0 Hz | 0.0 | 1.0 |
| 300.0 Hz | 0.0 | 1.0 |
| 420.0 Hz | 0.0 | 1.0 |
| ⋮ 36 | ⋮ 37 | ⋮ 38 |

FIG. 4

| Frequency | Adjustment factors for negative power flow (from nominal load to nominal source) | Adjustment factors for positive power flow (from nominal source to nominal load) |
|---|---|---|
| 60.0 Hz | 1.0 | 1.0 |
| 180.0 Hz | −2.0 | 1.5 |
| 300.0 Hz | −1.7 | 2.0 |
| 420.0 Hz | −1.5 | 2.2 |
| ⋮ 39 | ⋮ 40 | ⋮ 41 |

FIG. 5

HARMONIC-ADJUSTED WATT-HOUR METER

BACKGROUND OF THE INVENTION

1. Field of the Invention

This invention relates to the field of electric power measuring devices. More specifically, this invention relates to the accumulating and recording of watt-hours.

2. Description of the Prior Art

Electric power is ordinarily delivered to residences, commercial facilities, and industrial facilities as an Alternating Current (AC) voltage that approximates a sine wave with respect to time, and ordinarily flows through consumer premises as an AC current that also approximates a sine wave with respect to time. Ordinarily, a watt-hour meter is used to charge for the power that is consumed.

In an AC power distribution system, the expected frequency of voltage or current (usually 50 Hertz, 60 Hertz, or 400 Hertz) is usually referred to as the fundamental frequency, regardless of the actual spectral amplitude peak. Integer multiples of this "fundamental" are usually referred to as harmonic frequencies, and spectral amplitude peaks at frequencies below the fundamental are often referred to as "sub-harmonics", regardless of their ratio relationship to the fundamental.

It is widely recognized that loads which draw harmonic currents place an increased economic burden on the power distribution system by requiring derating of transformers and increased conductor area. If the non-fundamental currents, harmonics or sub-harmonics, are large relative to the impedance of the distribution system, they can induce harmonic voltages in the voltage delivered to other loads that share the distribution system. It is also possible for a load to accept power at the fundamental frequency and simultaneously act as a power source at a harmonic frequency. Under these circumstances, accurate watt-hour measurements fail to accurately measure the economic impact of the load.

For example, an accurate watt measurement treats the following two loads identically: a load that consumes 80 kilowatts at the fundamental frequency, and a load that consumes 100 kilowatts at the fundamental frequency and sources 20 kilowatts at the fifth harmonic. The latter, almost certainly has an adverse economic impact on the distribution system which traditional watt meters fail to measure.

Harmonic adjustments to watt-hour measurements can provide a better estimate of the economic impact of a non-linear load, and can encourage behavior by electric power consumers that match the goals of the electric power provider.

BRIEF DESCRIPTION OF THE DRAWINGS

FIG. 3 shows a table of adjustment factors that cause the invention to perform identically to prior art. FIG. 4 and FIG. 5 show examples of adjustment factors that might be chosen by electric power providers with differing economic strategies.

DETAILED DESCRIPTION OF A PREFERRED EMBODIMENT

Figure 1:
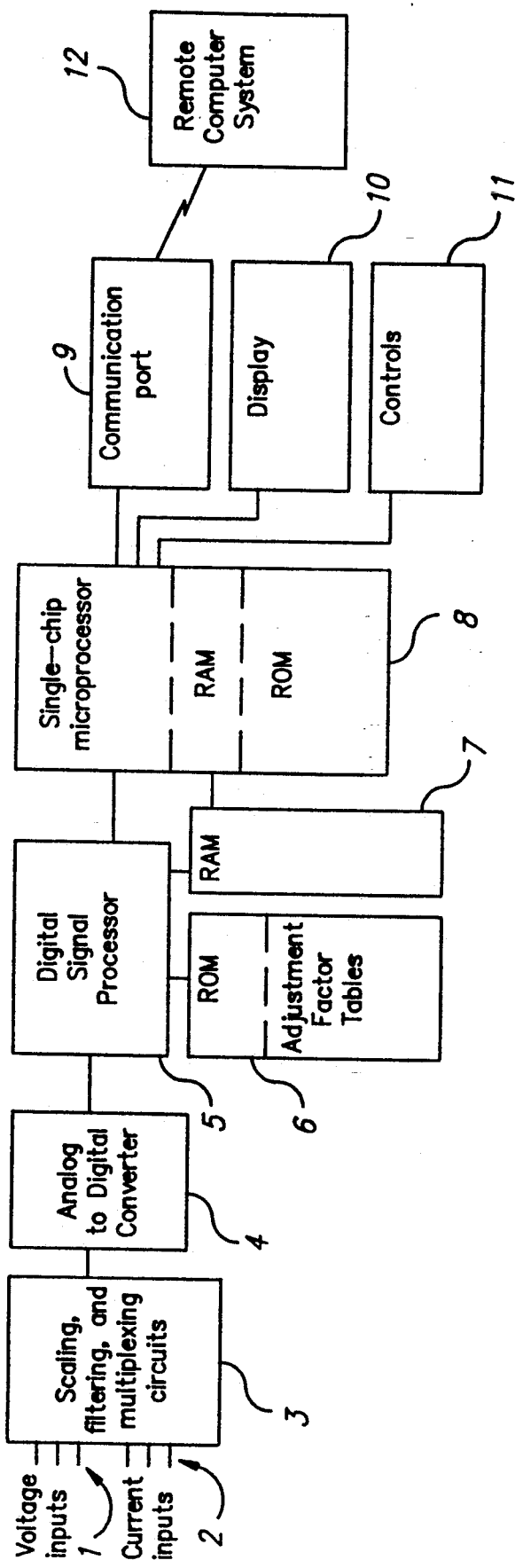
FIG. 1 shows a block diagram of an apparatus operating in accordance with an embodiment of the invention.

Beginning at the far left of FIG. 1, three voltages signals 1 from an AC power system and corresponding currents signals 2 are sensed in power lines. The sensed voltage signals 1 and current signals 2 are applied to circuits 3 that employ any well-known techniques to scale the signals to an appropriate level for further processing, filter out frequencies that are not of interest, and present appropriately multiplexed signals to an Analog to Digital Converter 4.

Figure 2:
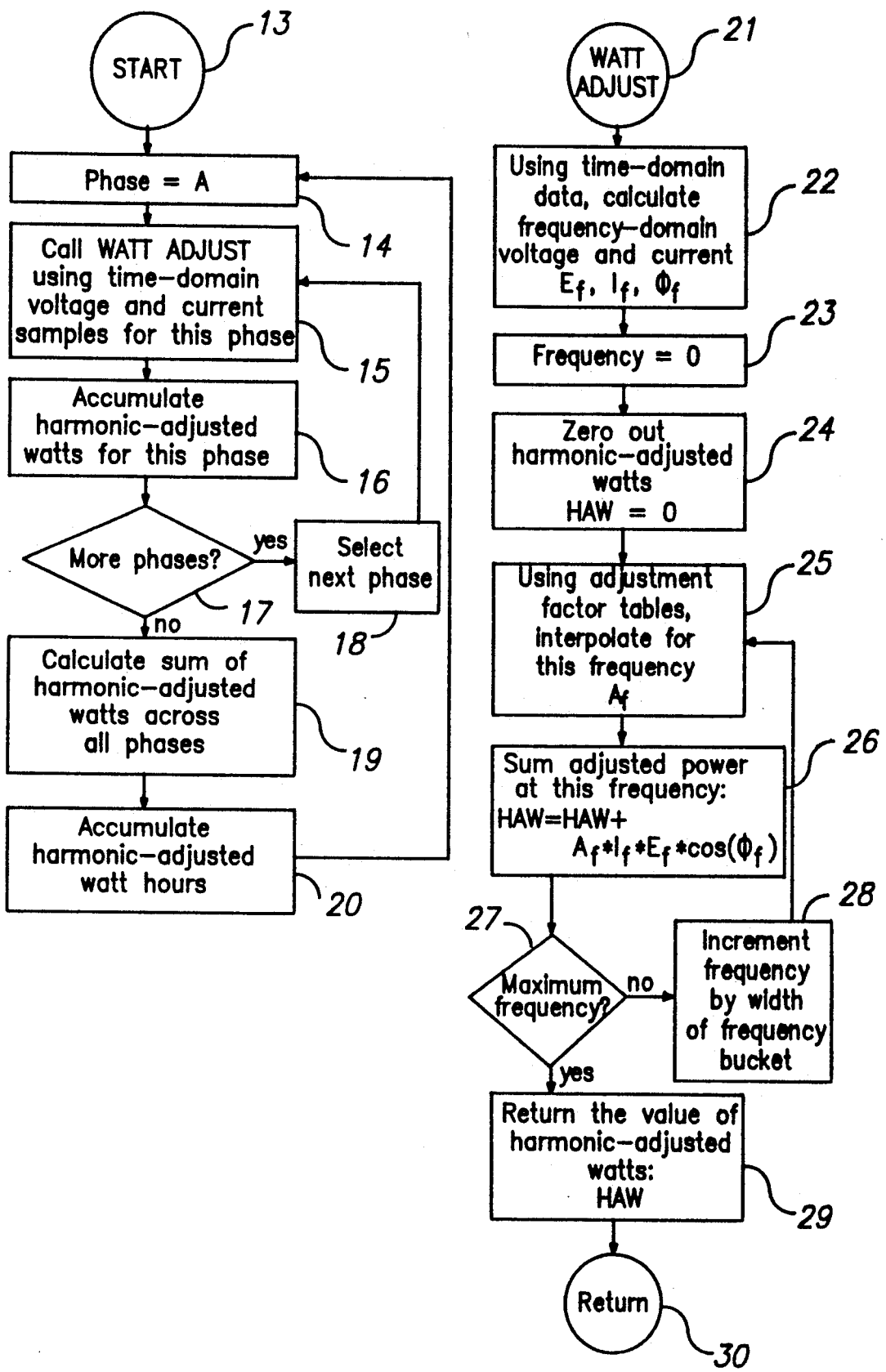
FIG. 2 shows a flow diagram of the key algorithm of the invention.

A digital signal processor 5 with associated ROM memory 6 and RAM memory 7 executes the algorithm of FIG. 2, with the exception of the block 20 which is executed by the microprocessor 8. The digital signal processor 5 calculates the frequency spectra for each voltage and current, using a Fourier transform or any other well known algorithm. The digital signal processor 5 then calculates the true power flow at each frequency using any well known algorithm. It then adjusts the power spectrum according to a table of frequency adjustments stored in memory 6, examples of which are shown in FIG. 3, FIG. 4, and FIG. 5, making appropriate interpolations where necessary.

The digital signal processor 5 then calculates the harmonic-adjusted power flow, and transmits it, using any well-known technique such as serial communication or Direct Memory Access, to the single-chip microprocessor 8 which incorporates internal timers, communication channels, program memory, and data memory. The microprocessor 8 then accumulates the harmonic-adjusted watt measurement in a harmonic-adjusted watt-hour register, and displays the result in a display 10. A communication port 9 allows any other digital system to read the present measurement value, and to read and reset the registers, which can also be read and reset with manual controls 11.

The circuits 3 through 8, or any parts thereof, may be included in a single integrated circuit such as an application specific integrated circuit (ASIC). The circuits 3 through 8, or any parts thereof, may perform other functions in addition to the functions described above, such as measuring and accumulating other parameters related to power flow.

Turning now to FIG. 2, the invention continuously executes the process which begins at START 13. In the Block 14, the digital signal processor 5 begins by selecting the first phase for analysis. The time-domain digital samples of voltage and current are passed to the subroutine WATT ADJUST by the block 15, which returns the value of harmonic-adjusted watts for this phase. The block 16 accumulates the harmonic-adjusted watts for this phase.

The blocks 17 and 18 cause the process to be repeated for additional phases. The block 19 calculates the sum of harmonic-adjusted watts across all phases; this is equivalent to the instantaneous harmonic-adjusted power in watts. The block 20, which is executed by the microprocessor 8, accumulates the instantaneous harmonic-adjusted watts over time, thus calculating harmonic-adjusted watt hours.

In the subroutine WATT ADJUST 21 time-domain samples of voltage and current for a single phase are transformed into the harmonic-adjusted watts for that phase. In the block 22, the subroutine uses any well-known technique such as Fourier Transform to calculate the frequency domain data for these signals, including frequency domain voltage $E_f$, frequency domain current $I_f$, and the phase angle $\phi_f$ between each frequency domain voltage bucket and its corresponding voltage domain bucket. Beginning at the lowest frequency, the subroutine employs the blocks 23, 27, and 28 to scan across each of the frequency components. The block 24 sets the initial value of harmonic-adjusted watts to zero.

The block 25 first determines if the watts are positive or negative at this frequency, using any well known technique to calculate watts such as the product of voltage, current, and the cosine of the angle between the voltage and current. Block 25 then inspects the adjustment tables, examples of which are shown in FIG. 3, FIG. 4, and FIG. 5, and determines the appropriate adjustment factor $A_f$. The block 25 may use interpolation if necessary to determine an adjustment factor $A_f$.

The block 26 adds the harmonic-adjusted watts at this frequency to the accumulated harmonic-adjusted watts. After all frequencies have been scanned by the blocks 27 and 28, the block 29 returns the accumulated harmonic-adjusted watts for this phase.

Each of FIG. 3, FIG. 4, and FIG. 5, illustrates one possible set of adjustment factors which can be employed in the algorithm shown in FIG. 2. Using FIG. 3 as an example, each of these tables consists of a set of frequencies 33 with corresponding adjustment factors for negative power flow (from the nominal load to the nominal source) 34 and adjustment factors for positive power flow (from the nominal source to the nominal load) 35.

FIG. 3 illustrates adjustment factors that cause the invention to behave identically with prior art, as all of the adjustment factors have unity value. Thus, no matter what the configuration of the load is, the adjusted watt-hour value is the same as the measured watt-hour value.

FIG. 4 illustrates adjustment factors that would be appropriate for an electric power provider whose policy is to sell power at standard rates for any frequency at which the power consumer consumes power 38, but to refuse to purchase power from the power consumer at any frequency other than the fundamental 37.

FIG. 5 illustrates adjustment factors that would be appropriate for an electric power provider whose policy is to first charge higher rates for power consumer by the power consumer at frequencies other than the fundamental 41, and second, to charge the power consumer when the power consumer delivers power to the electric power provider at frequencies other than the fundamental 40. The adjustment factors 40 are negative because they are multiplied by negative watts, yielding a positive value in adjusted watts.

FIG. 3, FIG. 4, and FIG. 5 show frequencies that are odd multiples of 60 Hertz 33, 36, 39. Similar tables can be constructed for odd multiples of 50 Hertz, 400 Hertz, or any other fundamental frequency of interest. It is convenient to restrict the tables to frequency values where power flow is most likely, but the table may contain entries for any frequency from 0 Hertz up to one-half the sampling frequency employed by the analog to digital converter 4.

FIG. 4 and FIG. 5 are illustrative examples of possible tables of adjustment factors; tables with differing values can be constructed for electric power providers with differing economic goals.

The Adjustment Factor Tables shown in FIG. 3, FIG. 4, and FIG. 5 may be restored in RAM memory 7, allowing the values in the tables to be changed from time to time.

Various other modification may be made to preferred embodiment without departing from the spirit and scope of the invention as defined by the appended claims. Various other tables with different values of adjustment factors can be constructed without departing from the spirit and scope of the invention as defined by the appended claims.

We claim:

1. An instrument for measuring electric power consumed by a consumer, comprising:
   a. means for measuring a voltage and a current signal;
   b. means for calculating a watt consumption parameter over a plurality of frequencies, the means for calculating coupled to receive the voltage and current signals; and
   c. means for adjusting the watt consumption parameter in a predetermined manner related to a non-fundamental power consumption for forming an adjusted watt signal.

2. The instrument according to claim 1 wherein the means for measuring includes means for sensing time-domain current and the time-domain voltage.

3. The instrument according to claim 2 wherein the third means includes means for transforming the time-domain current into frequency-domain current and means for adjusting includes means for storing an adjustment table that is electronically coupled to the means for adjusting.

4. The instrument according to claim 1 wherein the means for measuring, the means for calculating and the means for adjusting comprise a digital signal processor.

5. The instrument according to claim 1 further comprising means for accumulating the adjusted watt signal over time for forming an adjusted watt-hour signal.

* * * * *

UNITED STATES PATENT AND TRADEMARK OFFICE
CERTIFICATE OF CORRECTION

PATENT NO. : 5,298,859
DATED : 03/29/94
INVENTOR(S) : McEachern et al.

It is certified that error appears in the above-identified patent and that said Letters Patent is hereby corrected as shown below:

In column 3, line 46, please replace "consumer" with --consumption--.

Signed and Sealed this

Second Day of August, 1994

Attest:

BRUCE LEHMAN

*Attesting Officer*  *Commissioner of Patents and Trademarks*